United States Patent
Tsang

(10) Patent No.: US 8,384,112 B2
(45) Date of Patent: Feb. 26, 2013

(54) LIGHT EMITTING CHIP

(75) Inventor: Jian-Shihn Tsang, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/283,610

(22) Filed: Oct. 28, 2011

(65) Prior Publication Data
US 2012/0241724 A1 Sep. 27, 2012

(30) Foreign Application Priority Data
Mar. 22, 2011 (TW) .............. 100109631 A

(51) Int. Cl.
*H01L 33/00* (2010.01)
(52) U.S. Cl. ............... 257/98; 257/99; 257/E33.065; 438/42
(58) Field of Classification Search ........... 257/79, 257/98, 99, 102, E33.01, E33.062, E33.065, 257/E33.068, 28; 438/42, 29
See application file for complete search history.

(56) References Cited

U.S. PATENT DOCUMENTS

| | | | | |
|---|---|---|---|---|
| 8,222,660 B2* | 7/2012 | Hwang | ............ | 257/98 |
| 8,258,533 B2* | 9/2012 | Seo et al. | ............ | 257/98 |
| 2010/0213481 A1* | 8/2010 | Hwang | ............ | 257/98 |
| 2012/0018763 A1* | 1/2012 | Engl et al. | ............ | 257/99 |
| 2012/0235114 A1* | 9/2012 | Tsang | ............ | 257/13 |

FOREIGN PATENT DOCUMENTS
WO WO-2010009690 A1 * 1/2010

* cited by examiner

*Primary Examiner* — Tuan N. Quach
(74) *Attorney, Agent, or Firm* — Altis Law Group, Inc.

(57) ABSTRACT

A light emitting chip includes a substrate, a reflective layer, a light emitting structure and a first electrode having a base formed between the reflective layer and the substrate. The light emitting structure includes a first semiconductor layer, an active layer and a second semiconductor layer. The first electrode further includes a connecting section extending upwardly from the base. An electrically insulating ion region is defined in the light emitting structure and extends from an upper surface of the base to the first semiconductor layer. A receiving groove is defined in the ion region and extends upwardly from the upper surface of the base to the first semiconductor layer. The connecting section is positioned in the receiving groove and electrically connects with the first semiconductor layer.

20 Claims, 2 Drawing Sheets

150,478 B2

LIGHT EMITTING CHIP

TECHNICAL FIELD

The disclosure generally relates to a light emitting chip.

DESCRIPTION OF RELATED ART

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

An LED generally includes a light emitting chip. Electrodes are formed on the light emitting chip for providing power supply to the light emitting chip. However, the electrodes are generally formed on an upper surface of the light emitting chip, which prevents a part of light from travelling to an external environment via the upper surface; therefore, a lighting extraction efficiency of the conventional light emitting chip is disadvantageously affected.

Therefore, a light emitting chip is desired to overcome the above described shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of a light emitting chip will now be described in detail below and with reference to the drawings.

Figure 1:
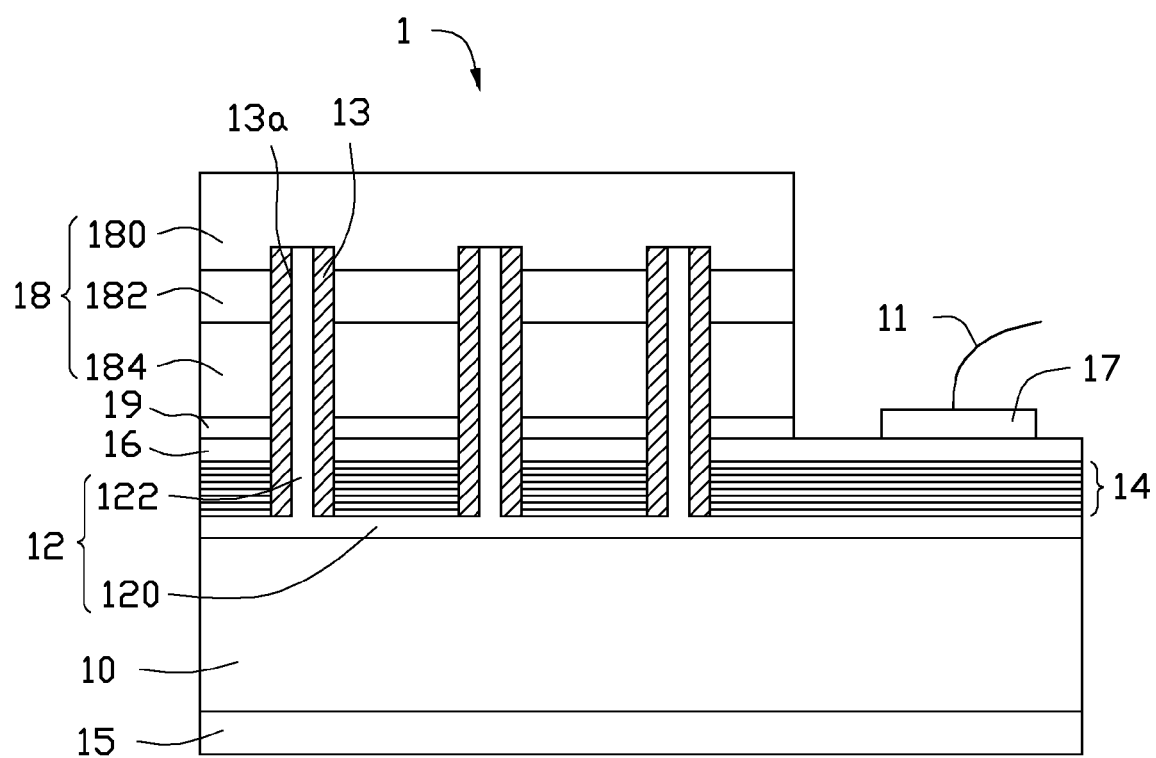
FIG. 1 shows a light emitting chip in accordance with a first embodiment of the present disclosure.

Referring to FIG. 1, a light emitting chip 1 in accordance with a first embodiment of the present disclosure includes a substrate 10, a first electrode 12 formed on the substrate 10, a reflective layer 14 formed on the first electrode 12, a transparent conductive layer 16 overlapped on the reflective layer 14, a second electrode 17 formed on the transparent conductive layer 16, a light emitting structure 18 and a connecting layer 19 formed between the light emitting structure 18 and the transparent conductive layer 16.

The light emitting structure 18 includes a first semiconductor layer 180, an active layer 182 and a second semiconductor layer 184. In this embodiment, the first semiconductor layer 180 is an n-type GaN layer, the second semiconductor layer 184 is a p-type GaN layer, and the active layer 182 is a multiple quantum well (MQW) GaN. The light emitting structure 18 is first grown on a temporary substrate (not shown), and then separated from the temporary substrate by laser lift-off, chemical etching or physical etching. A bottom surface of the second semiconductor layer 184, as shown in FIG. 1, is connected with the transparent conductive layer 16 through the connecting layer 19. The connecting layer 19 can be made of heavy doping p-type $In_{1-x-y}Al_xGa_yN$, p-type $In_{1-x-y}Al_xGa_yN$ with supper lattice structure, or p-doping inversion layer, therefore enhancing ohmic contact between the second semiconductor layer 184 and the transparent conductive layer 16. The transparent conductive layer 16 can be made of indium tin oxide (ITO), indium zinc oxide (IZO), zinc oxide (ZnO), magnesium oxide (MgO) or indium gallium zinc oxide (IGZO). The transparent conductive layer 16 is configured for spreading current uniformly into the second semiconductor layer 184 and achieving a uniform light distribution of the light emitting chip 1.

The reflective layer 14 is made of electrically insulating materials with high reflectivity. The light from the active layer 182 can be reflected by the reflective layer 14 to travel to an external environment, therefore improving light extraction efficiency of the light emitting chip 1. In this embodiment, the reflective layer 14 is a distributed Bragg reflector (DBR), which can reflect the light with a wavelength ranging from 440 nm to 470 nm. In this embodiment, the reflective layer 14 includes a plurality of $SiO_2$ films and $TiO_2$ films arranged alternately. In an alternative embodiment, the reflective layer 14 can be made of materials selected from a group consisting of $SiO_2$, $TiO_2$, $Ta_2O_5$, $SiN_x$, $TiN_x$ and $TaN_x$.

The first electrode 12 is made of materials selected from a group consisting of Cr, Ti, Ni, Pt, Al, Au, Ag, Cu, W and alloys thereof. The first electrode 12 includes a base 120 covering the substrate 10 and a plurality of connecting sections 122 extending upwardly from the base 120. The base 120 can be circular, annular, strip-shaped or grid-shaped. In this embodiment, the base 120 is strip-shaped. The light emitting chip 1 defines a plurality of ion regions 13 extending upwardly from an upper surface of the base 120 to an interior of the first semiconductor layer 180, as shown in FIG. 1. The ion regions 13 are formed by implanting a plurality of positive ions into the reflective layer 14, the transparent conductive layer 16, the connecting layer 19, and the light emitting structure 18. Each ion region 13 defines a receiving groove 13a therein. The receiving groove 13a extends upwardly from the upper surface of the base 120 to an interior of the first semiconductor layer 180 via physical etching or chemical etching. The connecting sections 122 are received in the receiving grooves 13a, respectively. The positive ions to form the ion regions 13 are selected from a group consisting of $H^+$, $He^+$, $O^+$, $Ar^+$, $N^+$, and $Ne^+$. The lattice defects of the ion regions 13 are increased because the implanted ions break up the lattice structure of the ion regions 13. Thus, the ion regions 13 can function as a high resistant insulation layer to insulate the connecting section 122 from the active layer 182, the second semiconductor layer 184, the connecting layer 19, the transparent conductive layer 16, and the reflective layer 14.

The substrate 10 is, made of electrically conductive metallic or semiconductor materials. The substrate 10 can be made of materials selected from a group consisting of Si, SiC, GaN, ZnO and $Al_2O_3$. A welding pad 15 is formed on a bottom surface of the substrate 10, opposite to the first electrode 12 as shown in FIG. 1. Therefore, the first semiconductor layer 180 is capable of being connected to external power source via the first electrode 12, the substrate 10 and the welding pad 15 in order.

The light emitting structure 18 is etched to expose a part of the transparent conductive layer 16. The second electrode 17 is formed on the exposed transparent conductive layer 16 and connected with the external power source through a metallic wire 11. Therefore, the second semiconductor layer 184 can be connected to the external power source via the connecting layer 19, the transparent conductive layer 16 and the second electrode 17 in order. Since the electrodes 12, 16 are not formed on the first semiconductor layer 180 of the light emitting chip 1, light emitting from the active layer 182 can wholly and easily travel to the external environment via an upper surface of the first semiconductor layer 180; accordingly, lighting extraction efficiency of the present light emitting chip 1 is high.

Figure 2:
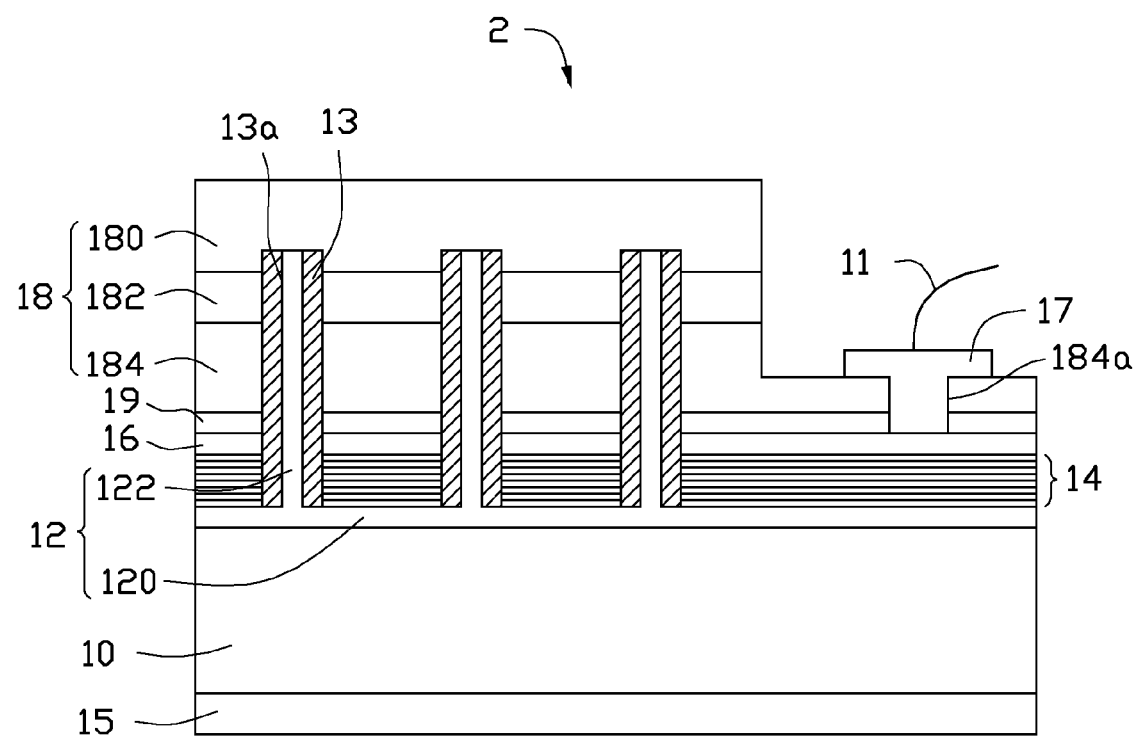
FIG. 2 shows a light emitting chip in accordance with a second embodiment of the present disclosure.

Referring to FIG. 2, a light emitting chip 2 in accordance with a second embodiment of the present disclosure is provided. Different from the first embodiment, the light emitting structure 18 is etched and a part of the second semiconductor layer 184 is exposed. A through hole 184a is defined in the second semiconductor layer 184 to extend from an exposed upper surface of the second semiconductor layer 184 via the connecting layer 19 to the transparent conductive layer 16. The second electrode 17 is formed on the second semiconductor layer 184 and extends in the through hole 184a to contact the transparent conductive layer 16.

In the light emitting chip 1, 2 described above, as shown in FIG. 1 or FIG. 2, the first electrode 12 is buried inside the light emitting chip 1, 2, rather than formed on the upper surface of the first semiconductor layer 180. Therefore, light emitting from the first semiconductor layer 180 will not be blocked by the first electrode 12, thereby improving illuminating efficiency of the light emitting chip 1, 2.

Besides, the reflective layer 14 can be made of thermal conductive materials to further improve heat dissipation efficiency of the light emitting chip 1, 2.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light emitting chip, comprising:
a substrate;
a first electrode formed on the substrate, the first electrode comprising a base and a connecting section extending upwardly from the base;
a reflective layer formed on the base, the reflective layer being made of insulating materials;
a light emitting structure formed on the reflective layer, the light emitting structure comprising a first semiconductor layer, a second semiconductor layer and an active layer formed between the first semiconductor layer and the second semiconductor layer, the second semiconductor layer being adjacent to the reflective layer;
an ion region extending from an upper surface of the base to the first semiconductor layer, the ion region being formed by implanting a plurality of ions into the reflective layer and the light emitting structure; and
a receiving groove being defined in the ion region and extending upwardly from the upper surface of the base to the first semiconductor layer, the connecting section being received in the receiving groove and electrically connected to the first semiconductor layer at one end.

2. The light emitting chip of claim 1, wherein the ions for forming the ion region are selected from a group consisting of $H^+$, $He^+$, $O^+$, $Ar^+$, $N^+$, and $Ne^+$.

3. The light emitting chip of claim 1, wherein the substrate is made of metallic or semiconductor materials.

4. The light emitting chip of claim 1, wherein a transparent conductive layer is formed between the second semiconductor layer and the reflective layer, the transparent conductive layer is made of materials selected from a group consisting of ITO, IZO, ZnO, MgO and IGZO.

5. The light emitting chip of claim 4, wherein a connecting layer is formed between the second semiconductor layer and the transparent conductive layer.

6. The light emitting chip of claim 5, wherein the connecting layer is made of materials selected from a group consisting of heavy doping p-type $In_{1-x-y}Al_xGa_yN$, p-type $In_{1-x-y}Al_xGa_yN$ with supper lattice structure, and p-doping inversion layer.

7. The light emitting chip of claim 4, wherein the light emitting structure is etched and a part of the transparent conductive layer is exposed, and wherein a second electrode is formed on the exposed part of the transparent conductive layer.

8. The light emitting chip of claim 4, wherein the light emitting structure is etched and a part of the second semiconductor layer is exposed, a through hole is formed in the second semiconductor layer and extending from an upper surface of the exposed part of the second semiconductor layer to the transparent conductive layer, and a second electrode is formed on the second semiconductor layer and extends in the through hole to contact the transparent conductive layer.

9. The light emitting chip of claim 1, wherein the reflective layer is a distributed Bragg reflector.

10. The light emitting chip of claim 9, wherein the reflective layer is made of materials selected from a group consisting of $SiO_2$, $TiO_2$, $Ta_2O_5$, $SiN_x$, $TiN_x$ and $TaN_x$.

11. The light emitting chip of claim 10, wherein the reflective layer comprises a plurality of $SiO_2$ films and a plurality of $TiO_2$ films alternately covering the base of the first electrode.

12. The light emitting chip of claim 1, wherein the reflective layer reflects light with a wavelength ranging between 440 nm and 470 nm.

13. The light emitting chip of claim 1, wherein materials of the first electrode are selected from a group consisting of Cr, Ti, Ni, Pt, Al, Au, Ag, Cu, W and alloys thereof.

14. A light emitting chip, comprising:
a light emitting structure comprising a first semiconductor layer, a second semiconductor layer and an active layer between the first semiconductor layer and the second semiconductor layer;
an ion region extending through the second semiconductor layer and the active layer, the ion region being formed by implanting a plurality of ions into the light emitting structure;
a through hole being defined through the ion region and extending into the first semiconductor layer; and
a first electrode for connecting the light emitting chip to an external power source, the first electrode being received in the through hole and being insulated from the second semiconductor layer and the active layer via the ion region, one end of the first electrode being connected to the first semiconductor layer, and the other end of the first electrode extending beyond the light emitting structure for connecting to the external power source.

15. The light emitting chip of claim 14, further comprising a connecting layer attached to the second semiconductor layer and a transparent conductive layer attached to the connecting layer, the transparent conductive layer being made of materials selected from a group consisting of ITO, IZO, ZnO, MgO and IGZO, the connecting layer being made of materials selected from a group consisting of heavy doping p-type $In_{1-x-y}Al_xGa_yN$, p-type $In_{1-x-y}Al_xGa_yN$ with supper lattice structure, and p-doping inversion layer.

16. The light emitting chip of claim 15, wherein a part of a side of the second semiconductor layer connected to the active layer is exposed, and a second electrode is formed on the exposed part of the side of the second semiconductor layer and extends through the second semiconductor layer and the connecting layer to connect the transparent conductive layer for connecting the light emitting chip to the external power source.

17. The light emitting chip of claim 14, further comprising a connecting layer attached to the second semiconductor layer and a transparent conductive layer attached to the connecting layer, a second electrode being formed on the transparent conductive layer for connecting with the external power source, the transparent conductive layer being made of materials selected from a group consisting of ITO, IZO, ZnO, MgO and IGZO, the connecting layer being made of materials selected from a group consisting of heavy doping p-type $In_{1-x-y}Al_xGa_yN$, p-type $In_{1-x-y}Al_xGa_yN$ with supper lattice structure, and p-doping inversion layer.

18. The light emitting chip of claim 17, further comprising an insulating layer attached to the transparent conductive layer, and a conductive substrate, the other end of the first electrode extending through connecting layer, the transparent conductive layer and the insulating layer to connect with the conductive substrate.

19. The light emitting chip of claim 17, wherein the first electrode further comprises a flat base formed on the other end thereof, an insulating layer being formed between and interconnecting the flat base and the conductive layer, a conductive substrate being attached to the flat base of the first electrode.

20. The light emitting chip of claim 17, wherein the insulating layer comprises a plurality of $SiO_2$ films and $TiO_2$ films, and the plurality of $SiO_2$ films and $TiO_2$ films are alternately arranged and capable of reflecting light with a wavelength ranging from 440 nm to 470 nm.

* * * * *